US010060996B2

(12) United States Patent
Naka et al.

(10) Patent No.: US 10,060,996 B2
(45) Date of Patent: Aug. 28, 2018

(54) GRADIENT MAGNETIC FIELD COIL DEVICE AND MAGNETIC RESONANCE IMAGING DEVICE

(71) Applicant: Hitachi, Ltd., Chiyoda-ku, Tokyo (JP)

(72) Inventors: Yasuhiro Naka, Tokyo (JP); Akira Kurome, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 311 days.

(21) Appl. No.: 14/655,256

(22) PCT Filed: Dec. 18, 2013

(86) PCT No.: PCT/JP2013/083885
§ 371 (c)(1),
(2) Date: Jun. 24, 2015

(87) PCT Pub. No.: WO2014/103827
PCT Pub. Date: Jul. 3, 2014

(65) Prior Publication Data
US 2015/0346297 A1 Dec. 3, 2015

(30) Foreign Application Priority Data
Dec. 25, 2012 (JP) ................................ 2012-280532

(51) Int. Cl.
*G01V 3/00* (2006.01)
*G01R 33/385* (2006.01)
(Continued)

(52) U.S. Cl.
CPC ......... *G01R 33/385* (2013.01); *G01R 33/307* (2013.01); *G01R 33/34* (2013.01); *G01R 33/3858* (2013.01)

(58) Field of Classification Search
None
See application file for complete search history.

(56) References Cited

U.S. PATENT DOCUMENTS 5,570,021 A 10/1996 Dachniwskyj et al.
6,278,276 B1* 8/2001 Morich ................ G01R 33/385
324/318
(Continued)

FOREIGN PATENT DOCUMENTS

CN 1714300 A 12/2005
CN 102481116 A 5/2012
(Continued)

OTHER PUBLICATIONS

International Search Report (PCT/ISA/210) dated Feb. 25, 2014, with English translation (Three (3) pages).
(Continued)

*Primary Examiner* — Louis Arana
(74) *Attorney, Agent, or Firm* — Crowell & Moring LLP

(57) ABSTRACT

A gradient magnetic field coil device has a main coil arrangement formed by embedding into first resin multiple main coils for generating a gradient magnetic field and a leakage magnetic field, and a shield coil arrangement formed by embedding into second resin multiple shield coils for suppressing the leakage magnetic field, wherein the shield coil arrangement includes a facing area that faces the main coil arrangement and is fixed to the main coil arrangement, and a protruding area that protrudes beyond the main coil arrangement, wherein insulated reinforcing members are embedded into the second resin in the protruding area. Multiple reinforcing members are arranged in a circumferential direction of the shield coil arrangement, and the second resin is preferably filled between the adjacent-to-each-other reinforcing members. The reinforcing members are preferably arranged toward the main coil arrangement with respect to the shield coils.

14 Claims, 10 Drawing Sheets

(51) Int. Cl.
*G01R 33/30* (2006.01)
*G01R 33/34* (2006.01)

(56) References Cited

U.S. PATENT DOCUMENTS

| | | | |
|---|---|---|---|
| 2005/0146330 A1* | 7/2005 | Teklemariam | G01R 33/385 324/318 |
| 2006/0033496 A1 | 2/2006 | Shvartsman et al. | |
| 2008/0094062 A1 | 4/2008 | Edelstein et al. | |
| 2012/0176137 A1 | 7/2012 | Terada et al. | |

FOREIGN PATENT DOCUMENTS

| | | |
|---|---|---|
| JP | 2006-506155 A | 2/2006 |
| JP | 4360662 B2 | 11/2009 |
| JP | 2011-72461 A | 4/2011 |

OTHER PUBLICATIONS

Japanese language Written Opinion (PCT/ISA/237) dated Feb. 25, 2014 (Three (3) pages).
Chinese-language Office Action issued in counterpart Chinese Application No. 201380061471.7 dated Feb. 16, 2017 (Five (5) pages).

\* cited by examiner

GRADIENT MAGNETIC FIELD COIL DEVICE AND MAGNETIC RESONANCE IMAGING DEVICE

TECHNICAL FIELD

The present invention relates to a gradient magnetic field coil device for generating a gradient magnetic field in which magnetic field intensity is tilted, and a magnetic resonance imaging device (hereinafter, referred to as an MRI device) having the same.

BACKGROUND ART

An MRI device is primarily configured with: a static magnetic field magnet that generates a static magnetic field in an imaging space; an RF coil for generating a nuclear magnetic resonance (NMR) signal from the subject; and a gradient magnetic field coil device that generates a gradient magnetic field to provide position information to the NMR signal. Here, in the gradient magnetic field coil device, a main coil arrangement that generates a gradient magnetic field is integrated with a shield coil arrangement that is arranged outside the main coil arrangement to suppress a leakage magnetic field from being generated. The main coil arrangement and the shield coil arrangement have a hollow cylindrical shape, wherein the axial length of the shield coil arrangement is longer than the axial length of the main coil arrangement in order to obtain a sufficient electromagnetic shielding effect for shielding the leakage magnetic field from the main coil arrangement. Therefore, the shield coil arrangement protrudes beyond ends of the main coil arrangement. On the other hand, securing enough space is proposed in a direction of a shoulder width of the subject so as not to give a feeling of pressure to the subject (see Japanese Patent Application Publication No. 2011-072461, for example). In Patent Application Publication No. 2011-072461, the outer circumferential surface of the gradient magnetic field coil follows a hollow cylindrical shape, but the inner circumferential surface thereof is wider in the direction of the shoulder width of the subject than in the other directions.

SUMMARY OF THE INVENTION

Problems to be solved

Conventionally, the gradient magnetic field coil device has a hollow cylindrical shape, and is formed to have a thin wall in order to expand the space for inserting the subject. This causes the shield coil arrangement to be formed to have an even thinner wall at portions protruding beyond the ends of the main coil arrangement. Thus, the shield coil arrangement is reduced in rigidity to have the amplitude of vibration increased during operation of the MRI device, causing a concern for a damage such as exfoliation of a bonded interface between the main coil arrangement and the shield coil arrangement protruding beyond the ends of the main coil arrangement.

In addition, as is the case in Japanese Patent Application Publication No. 2011-072461, when the gradient magnetic field coil device has the inner circumferential surface being wide in the direction of the shoulder width of the subject, while having the outer circumferential surface in a cylindrical shape, the gradient magnetic field coil device may have an even thinner wall locally in the circumferential direction. This also causes a concern for a damage such as bonding being locally broken on the bonded interface.

Therefore, the present invention is intended to provide a gradient magnetic field coil device which can be formed to have a thin wall but is hardly damaged, and an MRI device having the same, to solve the aforesaid problems.

Solution to Problems

In order to solve the above problems, the present invention provides a gradient magnetic field coil device having; a main coil arrangement that is formed by embedding into first resin a plurality of main coils for generating a gradient magnetic field and a leakage magnetic field; and a shield coil arrangement that is formed by embedding into second resin a plurality of shield coils for suppressing the leakage magnetic field, wherein the shield coil arrangement includes a facing area that faces the main coil arrangement and is fixed to the main coil arrangement, and a protruding area that protrudes beyond the main coil arrangement, wherein the second resin in the protruding area is embedded with insulated reinforcing members.

In addition, the present invention provides an MRI device including: the gradient magnetic field coil device; and a static magnetic field magnet device that generates a static magnetic field which is uniform in terms of time and space, wherein the gradient magnetic field and the static magnetic field overlap in an imaging space.

Advantageous Effects of the Invention

According to the present invention, a gradient magnetic field coil device that can be formed to have a thin wall but is hardly damaged, and an MRI device having the same can be provided. Note that problems, configurations, and advantages other than those described above will be apparent in the description of embodiments hereinbelow.

EMBODIMENTS OF THE INVENTION

Figure 1:
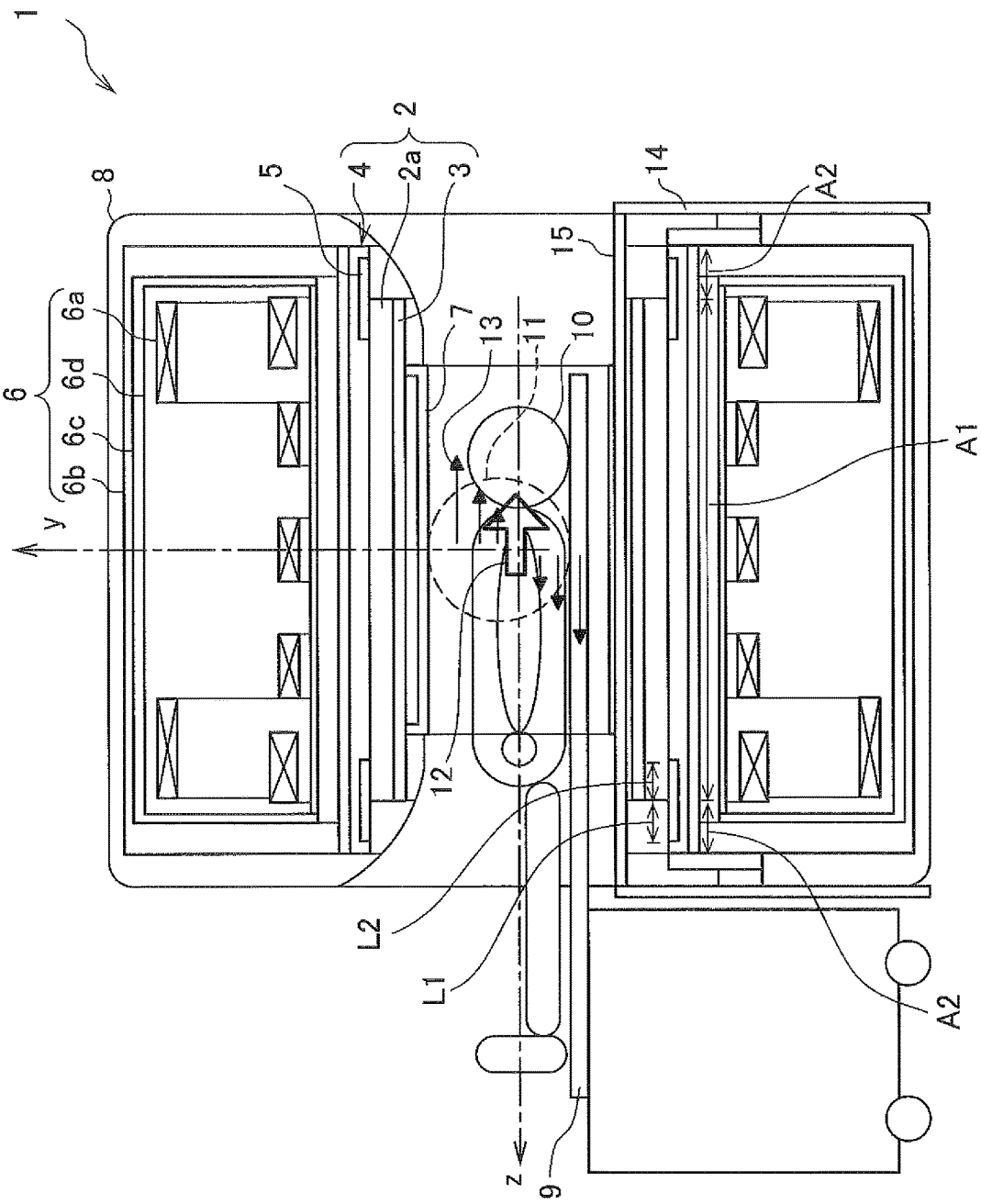
FIG. 1 is a longitudinal sectional view of a magnetic resonance imaging device (MRI device of horizontal magnetic field type) according to a first embodiment of the present invention.

Next, embodiments of the present invention will be described in detail with reference to the accompanying drawings as appropriate. Note that, in the drawings, common parts will be denoted by the same reference numerals, and duplicated descriptions will be eliminated.

First Embodiment

FIG. 1 shows a longitudinal sectional view of a magnetic resonance imaging device (MRI device of horizontal magnetic field type) according to a first embodiment of the present invention. FIG. 1 is a sectional view taken in a plane along the body axis direction of a subject 10. According to the MRI device 1, a nuclear magnetic resonance phenomenon is utilized, which occurs when the subject 10 laid in a uniform static magnetic field 12 is irradiated with high-frequency pulses, to obtain a cross-sectional image showing physical and chemical properties of the subject 10. This cross-sectional image is used especially in medical treatment.

The MRI device 1 includes: a static magnetic field magnet device 6 that generates the static magnetic field 12, which is uniform in terms of time and space, into an imaging space 11 where the subjects 10 is inserted; a gradient magnetic field coil device 2 that generates in a pulsed manner a gradient magnetic field 13, in which magnetic field intensity is tilted in terms of space, into the imaging space 11 so as to overlap the static magnetic field 12, in order to provide position information; an RF coil 7 that irradiates the subject 10 with high frequency pulses to make nuclei in biological tissues of the subject 10 transmit magnetic resonance signals; a receiving coil (not shown) that receives the magnetic resonance signals; a computer system (not shown) that processes the received magnetic resonance signals to display an image; and a moving bed 9 that moves the subject 10 in a laid state into the imaging space 11. In addition, the MRI device 1 includes an outer cover 8 that is arranged so as to cover the static magnetic field magnet device 6 and the gradient magnetic field coil device 2. Note that the RF coil 7 is arranged toward the imaging space 11 with respect to the gradient magnetic field coil device 2 and can be seen from the subject 10 as if to cover the gradient magnetic field coil device 2, hence the RF coil 17 can be assumed to double the outer cover 8 in part. Further, the gradient magnetic field coil device 2 and the RF coil 7 are fixed to the static magnetic field magnet device 6 via support members 14, 15.

For the static magnetic field magnet device 6, an exemplary case will be described where a magnetic field direction of the uniform static magnetic field 12 generated in the imaging space 11 is horizontal. The static magnetic field magnet device 6 may employ a coil 6a, such as a superconductive coil which is cooled by refrigerant so as to be in a superconductive state, a permanent magnet (magnetic body), or both of these. In the first embodiment, a description will be given for an exemplary case of employing the coil 6a. That is, the static magnetic field magnet device 6 includes: a plurality of (e.g., seven in FIG. 1) coils 6a in a ring shape that are arranged in the body axis direction of the subject 10; a liquid helium vessel 6d that houses the coil 6a together with coolant of the liquid helium to cool the coils 6a; a radiation shield. 6c that shields radiant heat from a vacuum vessel 6b; and a vacuum vessel 6b that houses these in a vacuum environment. The vacuum vessel. 6b is in a hollow cylindrical shape. An outer circumferential wall and open end walls, at both ends, of the vacuum vessel 6b in a hollow cylindrical shape face the outer cover 8. An inner circumferential wall of the vacuum vessel 6b in a hollow cylindrical shape faces an outer circumferential wall of the gradient magnetic field coil device 2 in a hollow cylindrical shape. The vacuum vessel 6b requires vacuum strength to have a structure in which members made of stainless steel are welded. The imaging space 11 is surrounded by a static magnetic field magnet device 6 in a hollow cylindrical shape. The static magnetic field magnet device 6 generates a strong and uniform static magnetic field 12 in the imaging space 11 in the central axis direction (z-axis direction) of the static magnetic field magnet unit 6 in a hollow cylindrical shape. The subject 10 is moved into the imaging space 11 by the moving bed 9.

The gradient magnetic field coil device 2 has a substantially hollow cylindrical shape. The gradient magnetic field coil device 2 in a hollow cylindrical shape is arranged coaxially with, and inside of, the static magnetic field magnet unit 6. In the imaging space 11, the gradient magnetic field coil device 2 generates in a pulsed manner the gradient magnetic field 13 that has the same direction as the static magnetic field 12 and the magnetic flux density (magnetic field intensity) is tilted in a desired direction. In the gradient magnetic field coil device 2, the magnetic field direction (horizontal direction) of the static magnetic field 12 is usually defined as the z-axis as shown in FIG. 1, while the y-axis is defined to be a vertical direction perpendicular to the z-axis and the x-axis is defined to be a direction orthogonal to both the z-axis and the y-axis, and for these three directions of x, y, z, the gradient magnetic field coil device 2 can generate the gradient magnetic field 13 having magnetic field intensity tilted in respective directions. For example, an example of the gradient magnetic field 13 shown in FIG. 1 is a gradient magnetic field tilted in the direction of y.

The gradient magnetic field coil device 2 includes a main coil arrangement 3 in a hollow cylindrical shape that generates the gradient magnetic field 13 having magnetic field intensity tilted, and a shield coil arrangement 4 in a hollow cylindrical shape that suppress the leakage magnetic field of the main coil arrangement. The main coil arrangement 3 and the shield coil arrangement 4 are bonded by interlayer resin 2a for integration. The main coil arrangement 3 is formed as if inserted into the shield coil arrangement 4 in a hollow cylindrical shape. The axial length of the shield coil arrangement 4 is made so as to be longer than that of the main coil arrangement 3 in order to obtain a sufficient electromagnetic shielding effect for shielding the leakage magnetic field from the main coil arrangement 3. Therefore, the shield coil arrangement 4 protrudes beyond the ends of the main coil arrangement 3. The shield coil arrangement 4 includes a facing area A1 that faces the main coil arrangement 3 and is fixed to the main coil arrangement 3, and protruding areas A2 that protrude beyond the main coil arrangement 3. In the MRI device 1, the hollow cylindrical shape of the gradient magnetic field coil device 2 is formed to have a thin wall in order to expand the space for inserting the subject 10. The main coil arrangement 3 and the shield coil arrangement 4, each having a hollow cylindrical shape, are also formed to have thin walls, respectively. The main coil arrangement 3 and the shield coil arrangement 4, each having such a thin wall, can be formed with a bobbinless coil. This causes the protruding area A2 of the shield coil arrangement 4 to be also thin. Then, the protruding area A2 is arranged with insulated reinforcing members 5. The reinforcing member 5 is made of insulated material such as FRP (Fiber Reinforced Plastics). The reinforcing member 5 allows for increasing the rigidity in the protruding area A2, reducing the amplitude of vibration in the protruding area A2 of the shield coil arrangement 4 when the MRI device 1 is in operation, and suppressing damages such as exfoliation of the bonding interface between the main coil arrangement 3 and the shield coil arrangement 4 at a root side of the protruding area A2. The reinforcing members 5 are arranged in the shield coil arrangement 4 toward the main coil arrangement 3 or the interlayer resin 2a. The reinforcing members 5 extend not only in the protruding area A2 but also in the facing area A1. A length L1, in the axial direction (z-axis direction), of the reinforcing member 5 for a portion in the protruding area A2 is substantially equal to a length L2, in the axial direction, of the reinforcing member 5 for a portion in the facing area A1 (L1=L2).

The RF coil 7 is provided toward the imaging space 11 with respect to the gradient magnetic field coil device 2 for irradiating a high frequency pulsed magnetic field to the subject 10. The RF coil 7 is substantially in a hollow cylindrical shape, having a central axis which is coaxial with the static magnetic field magnet device 6 and the gradient magnetic field coil device 2 and coincides with the z-axis.

The outer cover 8 covers the static magnetic field magnet device 6, the gradient magnetic field coil device 2, and the RF coil 7, however, the RF coil 7 may be fitted into the outer cover 8 as shown in FIG. 1 so that the RF coil 7 also serves as the outer cover 8. The outer cover 8 is made of an insulated member such as FRP (Fiber Reinforced Plastics). The RF coil 7 may be arranged on an inner wall surface of the gradient coil unit 2 toward the imaging space 11. As the main coil device 3 is not arranged in an area corresponding to the projecting area A2 of the shield coil arrangement 4, the opening of the outer cover 8 can be spread outward in a trumpet shape such that the more outside the outer cover 8 is the larger the diameter thereof becomes. This allows for avoiding a feeling of pressure from being given to the subject 10.

Figure 2:
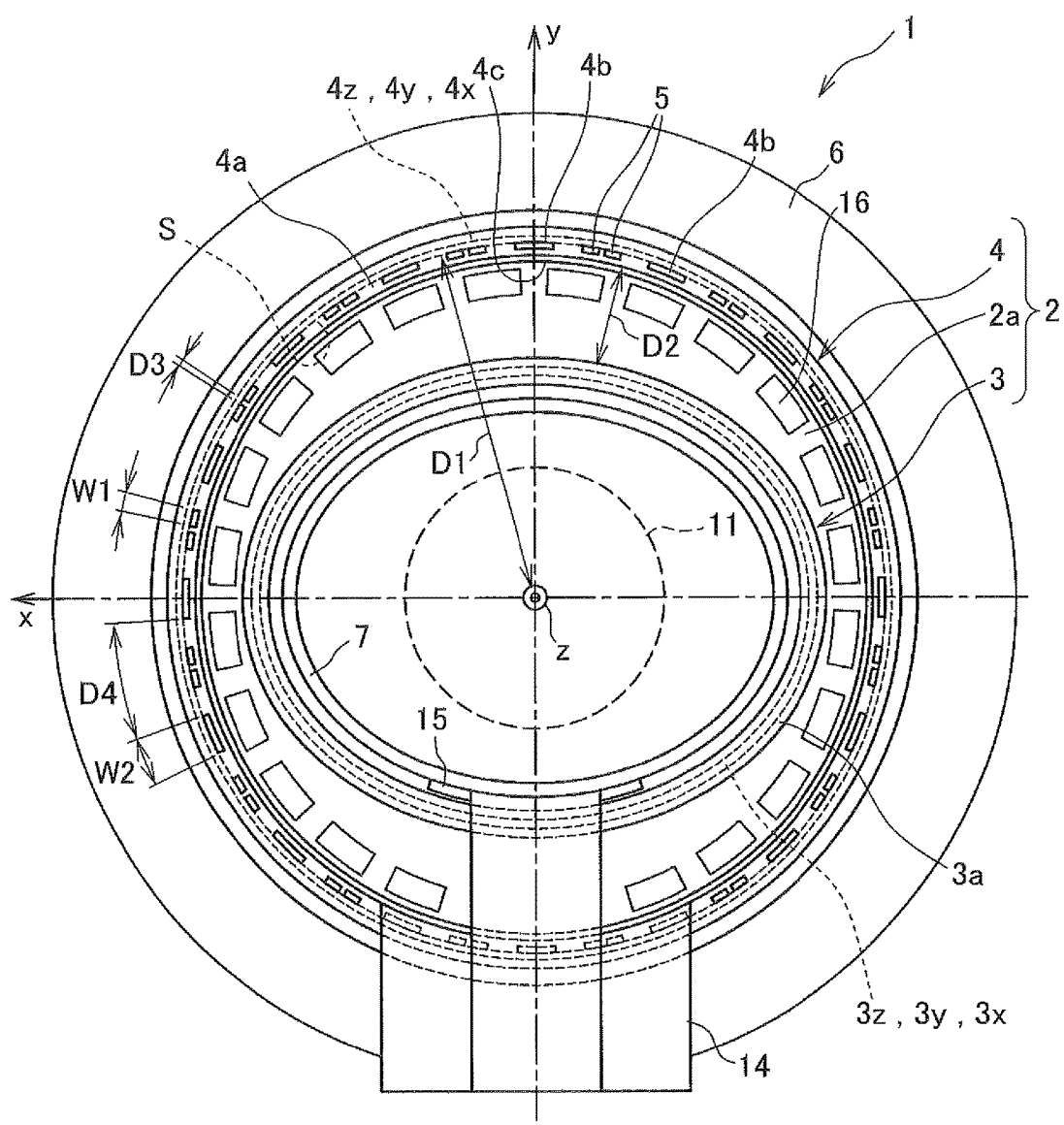
FIG. 2 is a side view, as seen through an outer cover from the z-axis direction, of the MRI device (of horizontal magnetic field type) according to the first embodiment of the present invention.

FIG. 2 shows a side view of the MRI device (horizontal magnetic field type) 1 according to the first embodiment of the present invention, as viewed from the z-axis direction to see through the outer cover 8. The static magnetic field magnet device 6 and the shield coil arrangement 4 of the gradient magnetic field coil device 2 are substantially in a hollow cylindrical shape having the z-axis as a central axis. The main coil arrangement 3 of the gradient magnetic field coil device 2 and the RF coil 7 are hollow cylinders having a cross section substantially in an elliptical shape, wherein the inner diameter (length) in the y-axis direction is larger than the inner diameter (length) in the x-axis direction. This allows the subject 10 (see FIG. 1) to secure a sufficient space in the shoulder width direction (x-axis direction) to lie comfortably. Thus, the subject 10 is released from a feeling of pressure. In addition, in the gradient magnetic field coil device 2, a distance D2 (thickness of the interlayer resin 2a) between the main coil arrangement 3 and the shield coil device 4 varies with positions in the circumferential direction around the z-axis. Specifically, the distance D2 (thickness of the interlayer resin 2a) becomes minimal (the smallest) in the circumferential direction at positions intersecting with a plane formed by the z-axis and the x-axis, where the interlayer resin 2a is formed so as to be locally thin.

The interlayer resin 2a is arranged with a plurality of shim trays 16 for arranging small pieces of magnetic material (iron) referred to as a shim. The plurality of shim trays 16 are arranged along the circumferential direction at equal intervals. Respective shim trays 16 are arranged with magnetic bodies (shims) having different mass to allow for increasing the uniformity, in the imaging space 11, of the static magnetic field 12 generated by the static magnetic field magnet device 6, inclusive of the effects due to magnetic fields generated by devices other than the MRI device 1, so as to be greater than or equal to a predetermined value, and for adjusting the magnetic field intensity so as to be uniform.

In addition, the main coil arrangement 3 includes main coils 3z, 3y, 3x for generating a gradient magnetic field. The main coils 3z, 3y, 3x are embedded in first resin 3a and formed in a hollow cylindrical shape.

Further, the shield coil arrangement 4 includes: shield coils 4z, 4y, 4x that suppress the leakage magnetic field; the reinforcing members 5; spacers 4b; and an insulating sheet 4c. The shield coils 4z, 4y, 4x are embedded in second resin 4a and formed in a hollow cylindrical shape. The reinforcing members 5 and the spacers 4b are also embedded in the second resin 4a. A plurality of the reinforcing members 5 and a plurality of the spacers 4b are arranged respectively in the circumferential direction of the shield coil arrangement 4. Then, the second resin 4a is filled between the reinforcing members 5 which are adjacent to each other, as well as between the reinforcing member 5 and the spacer 4b which are adjacent to each other, to fix to each other. A distance D3 in the circumferential direction between the reinforcing members 5, which are adjacent to each other, is in the order of 1 mm to several tens of mm. The distance D3 is provided for securing the fluidity of the second resin 4a, which is filled in order to integrate the shield coil arrangement 4, to prevent voids from being generated in the shielding coil arrangement 4. A distance in the circumferential direction between the reinforcing member 5 and the spacer 4b, which are adjacent to each other, is also in the order of 1 mm to several tens of mm. Note that in FIG. 2 the distance D3 between the reinforcing members 5, which are adjacent to each other, is depicted as being narrower than the distance between the reinforcing member 5 and the spacer 4b, which are adjacent to each other, but it is not limited thereto. The distance D3 can be equal to or wider than the distance between the reinforcing member 5 and the spacer 4b, which are adjacent to each other. Also note that in the present specification several tens of mm is meant to be greater than or equal to 20 mm but less than or equal to 30 mm.

Furthermore, a distance D4 in the circumferential direction between the adjacent spacers 4b is in the order of 50 mm to 150 mm. Outer surfaces of the reinforcing members 5 and the spacers 4b are along the side surface of the shield coil arrangement 4 (shield coils 4z, 4y, 4x). A width W1 in the circumferential direction of the reinforcing member 5 and a width W2 in the circumferential direction of the spacer 4b are in the order of 10 mm to several ten of mm. Therefore, when the width W1 and the width W2 are small, the reinforcing member 5 and the spacer 4b can be regarded as substantially rectangular bar (plate), however, when the width W1 and the width W2 become greater, the reinforcing member 5 and the spacer 4b can be in a curved-plate shape. Note that in FIG. 2, the width W1 is depicted as being smaller than the width W2, but it is not limited thereto. The width can be greater than or equal to the width. W2.

Moreover, the reinforcing members 5 and the spacers 4b as well as the insulating sheet 4c are arranged toward the main coil arrangement 3 (or the interlayer resin 2a) with respect to the shield coils 4z, 4y, 4x. The insulating sheet 4c is bonded to the interlayer resin 2a on one side and to the second resin 4a on the opposite side, over the entire circumference in the circumferential direction. Also, the reinforcing members 5 and the spacers 4b are installed on a virtual cylindrically curved surface S on which the coil conductors constituting the shield coils 4z, 4y, 4x are installed. In other words, the reinforcing members 5 and the spacers 4b are in contact with the shield coils 4z, 4y, 4x on the virtual cylindrically curved surface. The virtual cylindrically curved surface S is in a cylindrical shape having a central axis of the z-axis and a radius of a distance D1. The plurality of spacers 4b are arranged in the circumferential direction at equal intervals. A plurality of (two in the example of FIG. 2) reinforcing members 5 are arranged between the adjacent spacers 4b.

Figure 3:
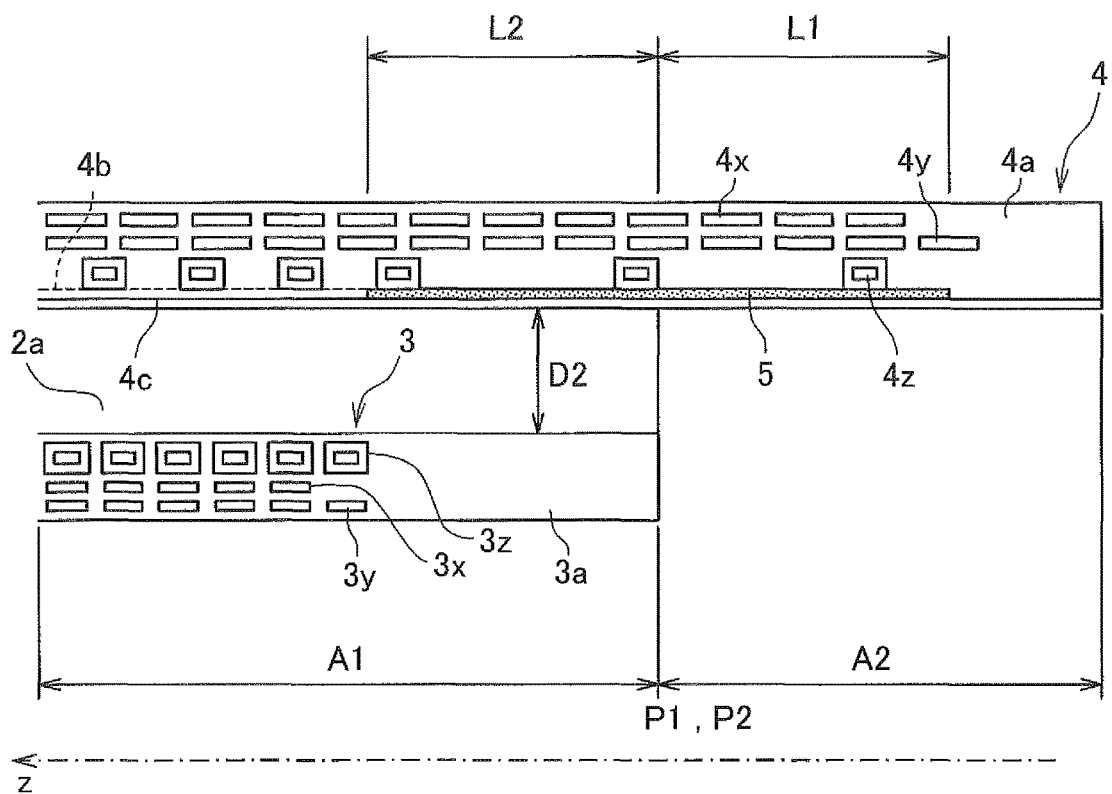
FIG. 3 is an enlarged view of an end of the gradient magnetic field coil device and the vicinity thereof in the longitudinal sectional view of the MRI device according to the first embodiment of the present invention.

FIG. 3 shows an enlarged view of an end of the gradient magnetic field coil device 2 and the vicinity thereof, in a longitudinal sectional view of the gradient magnetic field coil device 2 according to the first embodiment of the present invention. This enlarged view in FIG. 3 partially enlarges a region which is on a positive side of the y-axis as well as on a negative side of the z-axis in FIG. 1. The main coil arrangement 3 includes three layers of the main coils 3z, 3y, 3x in order to generate the gradient magnetic field 13 (see FIG. 1) independently for respective directions x, y, z. Also, the shield coil arrangement 4 includes three layers of the shield coils 4z, 4y, 4z to suppress the leakage magnetic field in response to three layers of the main coils 3z, 3y, 3x, respectively. Note that respective coil conductors are tubular for the main coil 3z and the shield coil 4z. A refrigerant can be flown through the tube to cool the main coil 3z and the shield coil 4z, and furthermore the gradient magnetic field coil device 2. The gradient magnetic field coil device 2 having such a configuration is referred to as an active-shield gradient magnetic field coil device, and is generally used in the MRI device 1 that has strong magnetic field intensity of the static magnetic field 12 and the gradient magnetic field 13 to generate a high-speed gradient magnetic field pulses. Additionally, insulating sheets such as made of FRP material are sandwiched, although not shown, between respective two layers in the three layers of the main coils 3z, 3y, 3x. Similarly, insulating sheets such as made of FRP material are sandwiched, although not shown, between respective two layers in the three layers of the shield coils 4z, 4y, 4z. In the main coil arrangement 3, the three layers of the main coils 3z, 3y, 3x and the insulating sheets between the layers are bonded in a layer shape by the first resin 3a for integration. In the shield coil arrangement 4, the three layers of the shield coils 4z, 4y, 4x, the insulating sheets between the layers, the reinforcing members 5, the spacers 4b, and the insulating sheet 4c are bonded in a layer shape by the second resin 4a for integration.

In the active-shield gradient magnetic field coil device 2, the shield coils 4z, 4y, 4x are longer in the z-axis direction than the main coils 3z, 3y, 3x. In addition, in the active-shield gradient magnetic field coil device 2, the main coils 3z, 3y, 3x and the shield coils 4z, 4y, 4x are connected in series, wherein the magnitude of the current flowing through the main coils 3z, 3y, 3x is substantially equal to that of the current flowing through the shield coils 4z, 4y, 4x, and these currents flow substantially in opposite directions from each other. As the main coils 3z, 3y, 3x and the shield coils 4z, 4y, 4x are arranged in close proximity, magnetic field intensity and a direction of the static magnetic field 12 (see FIG. 1), which is generated in a domain where the main coils 3z, 3y, 3x exist, are substantially equal to the magnetic field intensity and a direction of the static magnetic field 12, which is generated in a domain where the shield coils 4z, 4y, 4x exist. This static magnetic field 12 causes an electromagnetic force (Lorentz force) to act on the main coils 3z, 3y, 3x and the shield coils 4z, 4y, 4x. As the currents have the same magnitude in the main coils 3z, 3y, 3x and the shield coils 4z, 4y, 4x and flow in opposite directions from each other, the respective electromagnetic forces act in opposite directions from each other. In the facing area A1 where the main coils 3z, 3y, 3x and the shield coils 4z, 4y, 4x are arranged to face each other, the electromagnetic forces are canceled to suppress its center of gravity from moving (vibrating). On the other hand, in the protruding area A2 where only the shield coils 4z, 4y, 4x are arranged, the electromagnetic force is not canceled and acts on the protruding area A2 so as to be vibrated. This vibration travels toward a direction of peeling the shield coil arrangement 4 off the main coil arrangement 3. However, the reinforcing members 5 can reduce the amplitude of the vibration to suppress the peeling.

The length L1, in the axial direction (z-axis direction), of the reinforcing member 5 for a portion in the protruding area A2 is substantially equal to the length L2, in the axial direction, of the reinforcing member 5 for a portion in the facing area A1 (L1=L2). That is, in the z-axis direction, a central position P1 of the reinforcing member 5 substantially coincides with an end-surface position P2 of the main coil arrangement 3. Here, the lengths L1 and L2 fall in a range of 50 mm to 150 mm. As far as the lengths L1 and L2 fall in this range and have a relationship of L1=L2, vibration suppression effect can fully be obtained, as confirmed in a simulation by the finite element method. That is, there is no need to attach the reinforcing member 5 all over the facing area A1, and reinforcing can be achieved easily at low cost. In addition, the length of the reinforcing member 5 is short to allow the second resin 4a to be filled easily and reliably between the reinforcing members 5 to fix the reinforcing members 5, which are adjacent to each other, firmly and reliably with each other.

Figure 4A:
FIG. 4A is a perspective view of a reinforcing member.

FIG. 4A shows a perspective view of the reinforcing member 5. Hereinbelow, a description will be given of a method for manufacturing the gradient magnetic field coil device 2 according to the first embodiment of the present invention, particularly a method for manufacturing the shield coil arrangement 4. For those manufacturing methods, an exemplary case will be described where the reinforcing member 5 having a rectangular parallelepiped shape is used as shown in FIG. 4A.

Figure 4B:
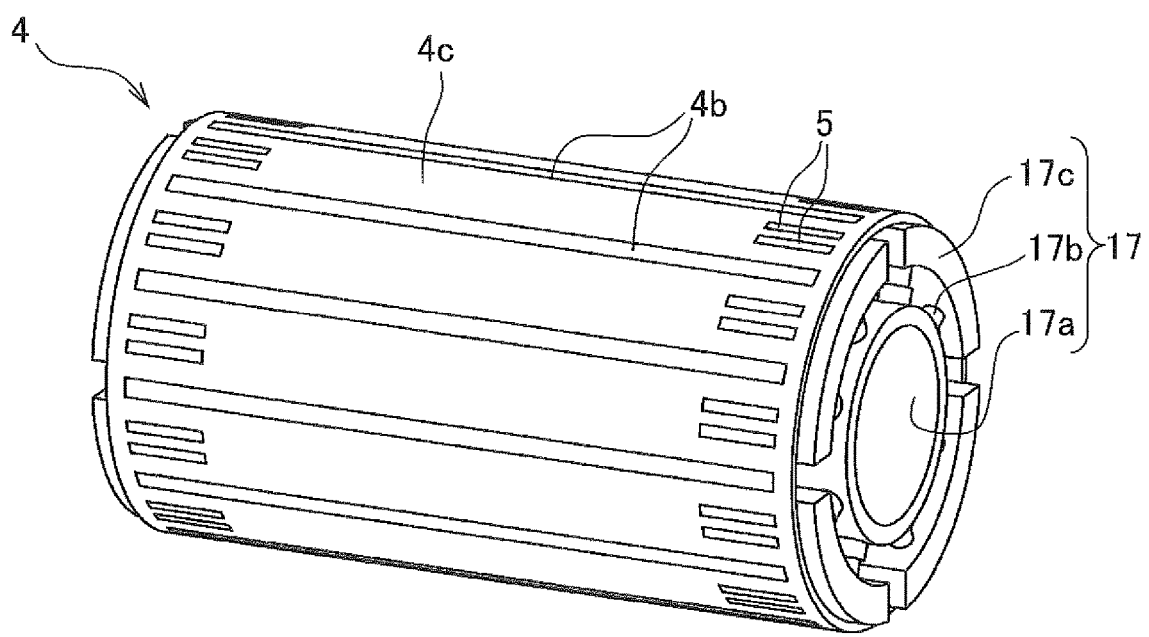
FIG. 4B is a perspective view (part 1) of a shield coil arrangement in the making to be arranged in the gradient magnetic field coil device according to the first embodiment of the present invention.

FIG. 4B shows a perspective view (part 1) of the shield coil arrangement 4 in the making to be arranged in the gradient magnetic field coil device 2 according to the first embodiment of the present invention. The shield coil arrangement 4 is a so-called bobbinless coil, and in its manufacturing method, a provisional bobbin 17 is prepared at first. The provisional bobbin 17 includes a base 17a in a hollow cylindrical shape, a movable wall 17c that is divided into a plurality of (four in an example in FIG. 4B) pieces and forms a hollow cylindrical shape in the aggregate, and variable spacers 17b that can move the movable wall 17c with respect to the base 17a. The movable wall 17c can be moved to expand or shrink the outside diameter of the hollow cylindrical shape formed by the movable wall 17c. Then, in the manufacturing method of the shield coil arrangement 4, the variable spacers 17b are used to set the outside diameter of the hollow cylindrical shape formed by the movable wall 17c so as to be substantially equal to the inside diameter of a given shield coil arrangement 4. Next, a thin insulating sheet 4c of glass epoxy is wound around the movable wall 17c of the provisional bobbin 17, and is temporarily fixed thereto using wax for temporary fixing or the like. A plurality of reinforcing members 5 and a plurality of spacers 4b, which are longer than the reinforcing members 5, are affixed on the insulating sheet 4c. The spacers 4b are in a rectangular parallelepiped shape and are arranged on the provisional bobbin 17 in the circumferential direction at equal intervals. The longitudinal direction of the spacer 4b is parallel to the axial direction of the provisional bobbin 17. The spacer 4b reaches from one end of the provisional bobbin 17 in the axial direction to the other end. The reinforcing members 5 have the longitudinal length shorter than half the longitudinal length of the spacers 4b and are arranged at both ends of the provisional bobbin 17 (spacers 4b) in the axial direction. That is, the reinforcing member 5 arranged on one end of the provisional bobbin 17 (spacer 4b) is apart from the reinforcing member 5 arranged on the other end thereof. A plurality of the reinforcing members 5 are arranged at both ends along the axial direction of the provisional bobbin 17. The reinforcing members 5 are arranged between the spacers 4b. Gaps are provided between the reinforcing members 5 as well as between the reinforcing member 5 and the spacer 4b to allow the second resin 4a (see FIG. 3) to be filled easily. In this manner, rings are formed at both ends by the reinforcing members 5 and the spacers 4b. Conversely, the reinforcing member 5 may be formed in a ring shape from the beginning. In this case, the reinforcing members 5 in a ring shape may be arranged at both ends and the spacers 4b may bridge those. Ceramic or resin such as glass epoxy may be used for the reinforcing member 5 and the spacer 4b. If resin such as glass epoxy is used for the reinforcing member 5 and the spacer 4b, glass may be spun into yarns to create fabric (sheeting), and then the fabric may be laminated and bonded to each other by impregnating them with the resin, to enhance their strength. The spun yarn (resin) has a property of being polarized optically, to allow for clearly distinguishing areas of the reinforcing members 5 and the spacers 4b, in which the spun yarns are densely packed, from the second resin 4a, even though all of them are made of the same kind of resin such as glass epoxy.

Figure 5:
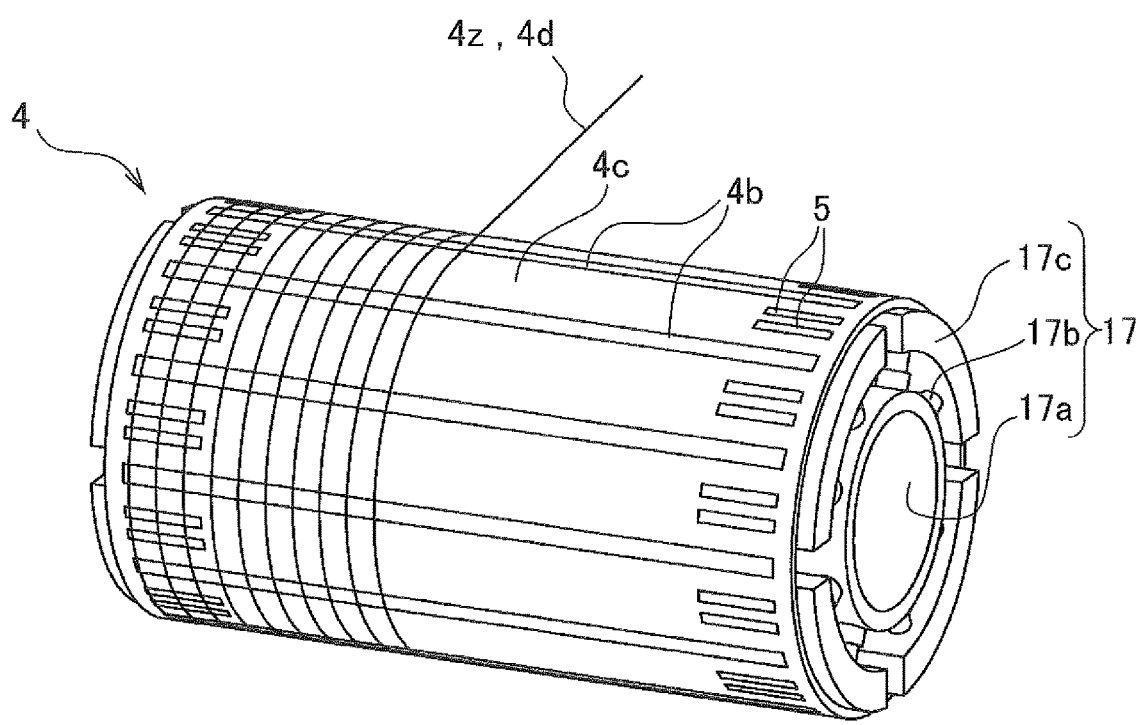
FIG. 5 is a perspective view (part 2) of the shield coil arrangement in the making to be arranged in the gradient magnetic field coil device according to the first embodiment of the present invention.

Next, as shown in FIG. 5, a coil conductor 4d is wound on the reinforcing members 5 and the spacers 4b to form a shield coil 4z. The reinforcing members 5 and the spacers 4b, particularly the spacers 4b, allows for winding the shield coil 4z in the axial direction at a constant diameter. Therefore, the thickness, in the radial direction, of the spacer 4b is preferably equal to or thicker than the thickness of the reinforcing member 5 in the radial direction. In addition, the distance D4, in the circumferential direction, between the spacers 4b, which are adjacent to each other, may be small enough relative to the outside diameter of the movable walls 17c (the inside diameter of the shield coil arrangement 4) such as being less than or equal to a tenth thereof, and is in the range of 50 mm to 150 mm. This can suppress the disturbance in the gradient magnetic field. In addition, as the coil conductor 4d is substantially wound around the provisional bobbin 17, a desired tension can be applied for winding.

Figure 6:
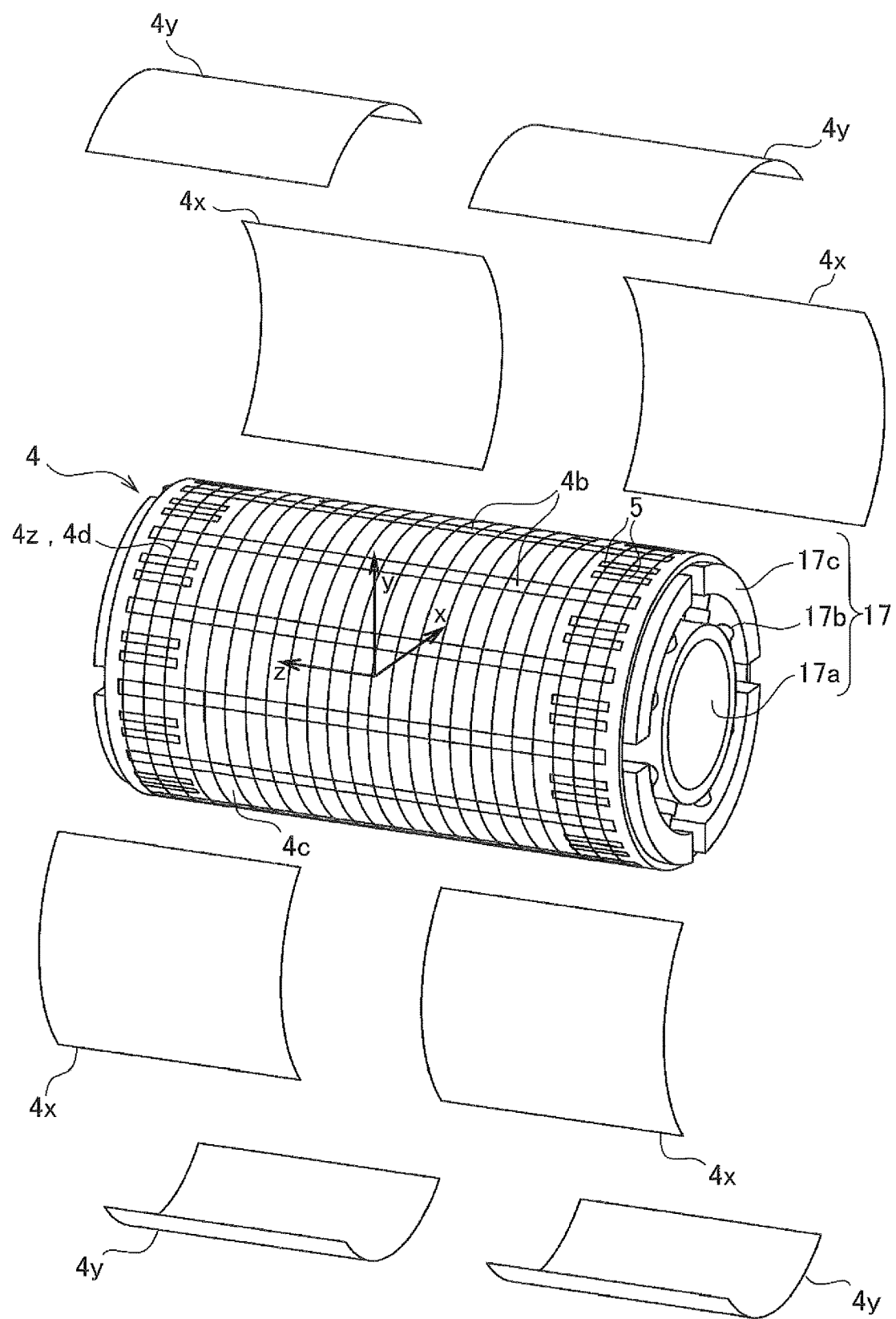
FIG. 6 is a perspective view (part 3) of the shield coil arrangement in the making to be arranged in the gradient magnetic field coil device according to the first embodiment of the present invention.

Next, as shown in FIG. 6, the shield coils 4y and the shield coils 4x are prepared and affixed to a predetermined position on the shield coil 4z (provisional bobbin 17). Four shield coils 4y are affixed to such positions to sandwich the provisional bobbin 17 (shield coil 4z) in the y-axis direction. Four shield coils 4x are affixed to such positions to sandwich the provisional bobbin 17 (shield coil 4z) in the x-axis direction. Note that the shield coils 4y, 4x are schematically shown in FIG. 6 as being in a plate shape, but in fact are formed in a spiral pattern. In addition, an insulating sheet is provided between the layers of the shield coils 4z, 4y, 4x. Then, the second resin 4a is poured in a melted state into the gaps formed by the shield coils 4z, 4y, 4x, the reinforcing members 5, the spacers 4b, and the insulating sheet 4c to seal them. When the second resin 4a is solidified, they are bonded integrally with each other. Finally, the temporary fixing wax is dissolved, and the variable spacer 17b is used to reduce the outside diameter of the movable wall 17c of the provisional bobbin 17. This allows the movable wall 17c to come off the shield coil arrangement 4 and then the provisional bobbin 17 to be removed from the shield coil arrangement 4. Note that if the temporary bobbin 17 can be removed from the shield coil arrangement 4 without using the temporary fixing wax, the temporary fixing wax may be eliminated, and further the insulating sheet 4c may be eliminated. In this case, the reinforcing members 5 and the spacers 4b can prevent the shield coil 4z from being exposed on the inner circumferential surface of the shield coil arrangement 4. The main coil arrangement 3 can be produced using a method for manufacturing a common bobbinless coil. The completed shield coil arrangement 4 and the main coil arrangement 3 are aligned with the concentric axis, and then the interlayer resin 2a in a melted state is injected between the shield coil arrangement 4 and the main coil arrangement 3 to seal them. When the interlayer resin 2a is solidified, the shield coil arrangement 4 and the main coil arrangement 3 are integrally bonded with each other to complete the gradient magnetic field coil device 2. Note that the second resin 4a and the interlayer resin 2a may be made of glass epoxy.

Second Embodiment

Figure 7A:
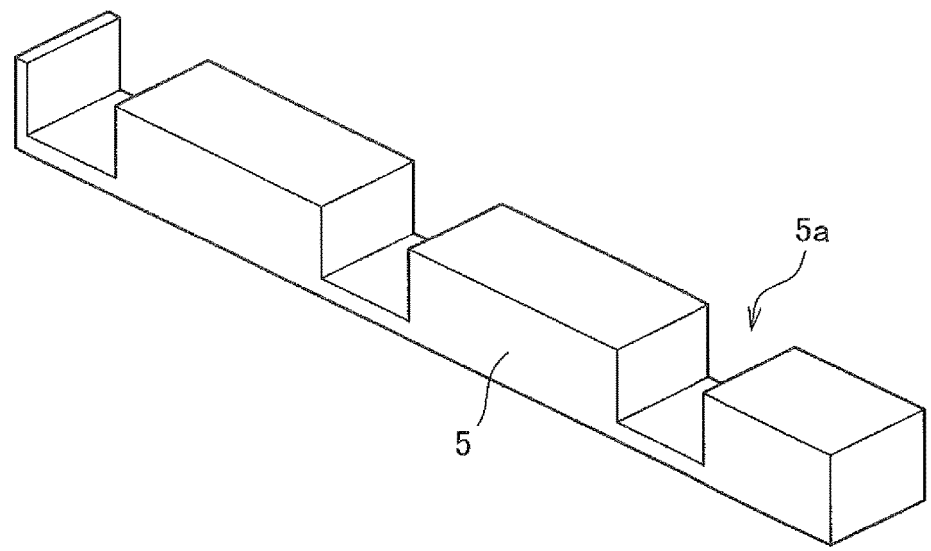
FIG. 7A is a perspective view of a reinforcing member to be arranged in the gradient magnetic field coil device according to a second embodiment of the present invention.

FIG. 7A shows a perspective view of the reinforcing member 5 provided in the gradient magnetic field coil device 2 according to a second embodiment of the present invention. The reinforcing member 5 of the second embodiment differs from the reinforcing member 5 of the first embodiment on the point that the former has grooves 5a. This causes the thickness of the reinforcing member 5 to be thicker by the amount of the depth of the groove 5a than that of the latter.

Figure 7B:
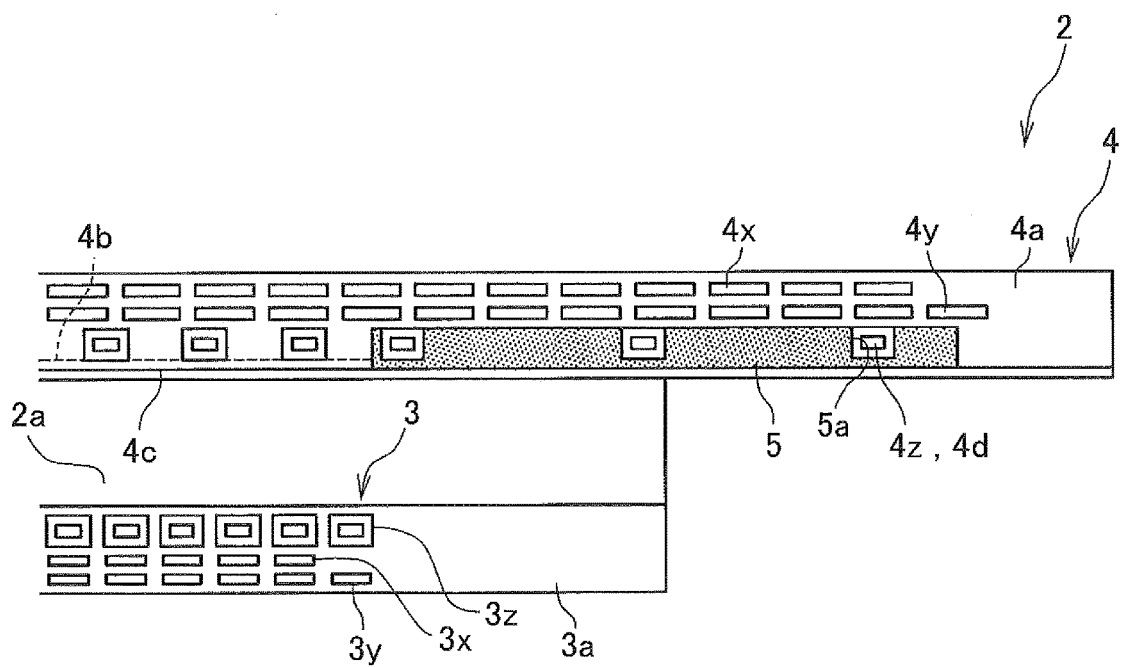
FIG. 7B is an enlarged view, in a longitudinal sectional view, of an end of a gradient magnetic field coil device according to the second embodiment of the present invention, and the vicinity thereof.

FIG. 7B shows an enlarged view of an end of the gradient magnetic field coil device 2 and the vicinity thereof in a longitudinal sectional view of said device according to the second embodiment of the present invention. The second embodiment differs from the first embodiment on the point that the coil conductor 4d of the shield coil 4z is embedded in the groove 5a formed in the reinforcing member 5. The depth of the groove 5a substantially coincides with the height of the coil conductor 4d of the shield coil 4z. This allows the reinforcing member 5 to have the thickness thicker by the amount of the height of the coil conductor 4d of the shield coil 4z than that of the first embodiment to enhance the rigidity of the reinforcing member 5 and therefore to improve the effectiveness of the reinforcement. This further allows the thickness of a portion of the reinforcing member 5 under the coil conductor 4d to be thinner than that of the first embodiment to make the thickness of the shield coil arrangement 4 thinner than that of the first embodiment. Additionally, the coil conductor 4d of the shield coil 4z is positioned by the groove 5a to allow for reducing variation in winding the coil conductor 4d of the shield coil 4z.

Third Embodiment

Figure 8:
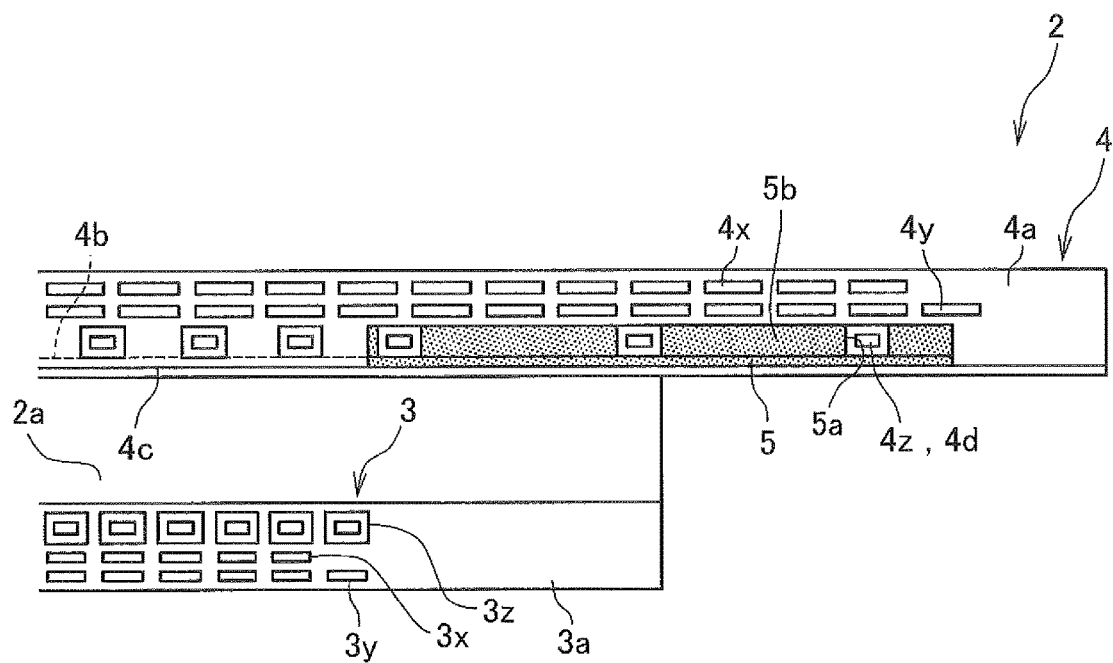
FIG. 8 is an enlarged view, in a longitudinal sectional view, of an end of a gradient magnetic field coil device according to a third embodiment of the present invention, and the vicinity thereof.

FIG. 8 shows an enlarged view of an end of the gradient magnetic field coil device 2 and the vicinity thereof in a longitudinal sectional view of said device according to a third embodiment of the present invention. The reinforcing member 5 of the third embodiment differs from that of the first embodiment on the point that first reinforcing members 5b are additionally provided between windings, which are adjacent to each other, of the coil conductors 4d, In making said device, the coil conductor 4d of the shield coil 4z is wound and then the first reinforcing members 5b are attached between the windings, which are adjacent to each other, of the coil conductor 4d. This can also improve the effectiveness of the reinforcement. In addition, the relative positions (distance) of the windings, which are adjacent to each other, of the coil conductor 4d are defined by the first reinforcing member 5b to allow for reducing the variation in winding the coil conductor 4d of the shield coil 4z.

Fourth Embodiment

Figure 9:
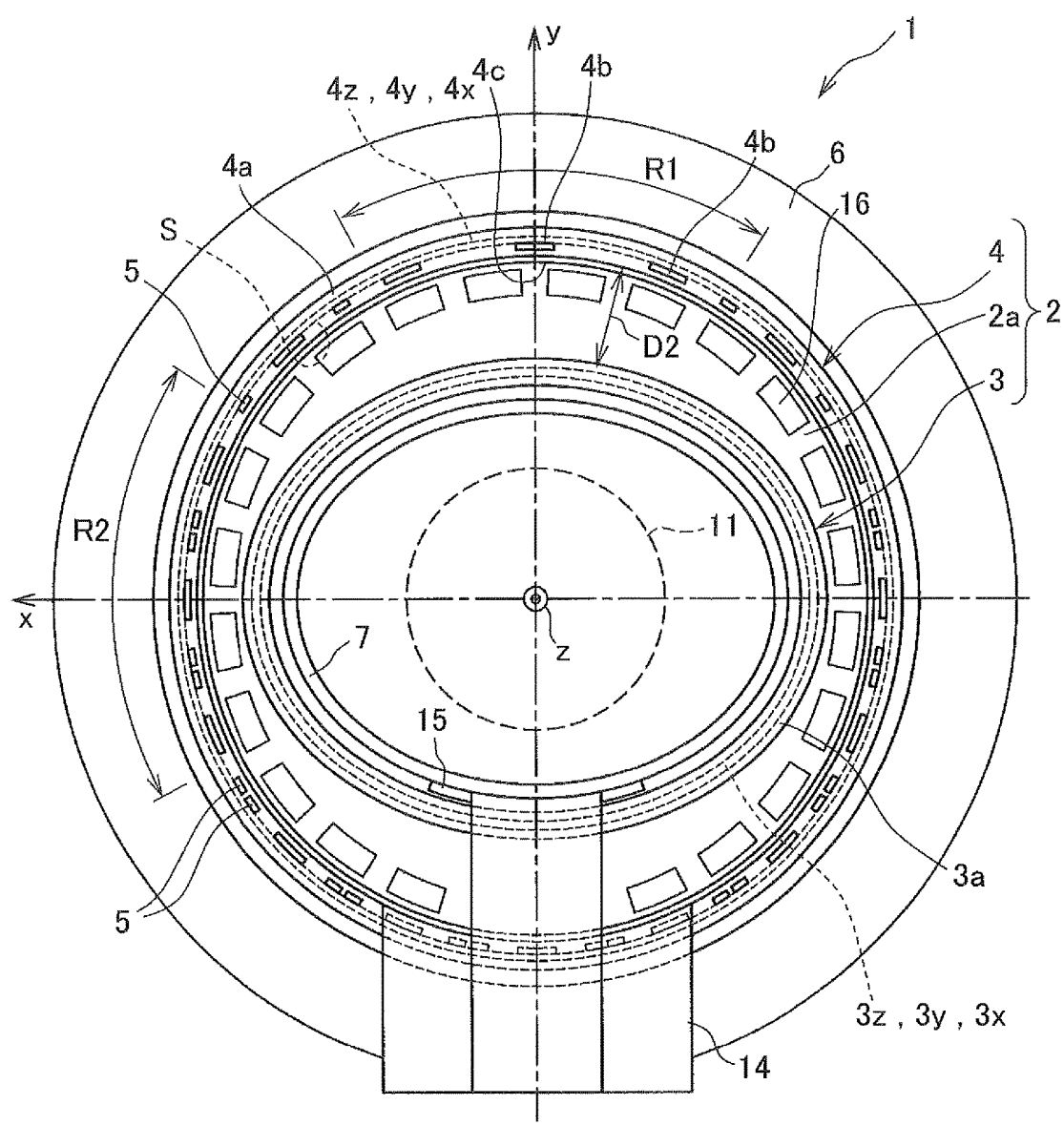
FIG. 9 is a side view, as seen through an outer cover from the z-axis direction, of the MRI device (of horizontal magnetic field type) according to a fourth embodiment of the present invention.

FIG. 9 shows a side view, as seen through the outer cover 8 from the z-axis direction, of the MRI device (horizontal magnetic field type) 1 according to a fourth embodiment of the present invention. The fourth embodiment differs from the first embodiment on the point that the reinforcing members 5 in the first embodiment are evenly arranged in the circumferential direction, while the reinforcing members 5 in the fourth embodiment are unevenly arranged in the circumferential direction. Specifically, the distance D2 between the main coil arrangement 3 and the shield coil arrangement 4 varies in the circumferential direction, wherein the distribution density of the reinforcing members 5 in a first range R1 having the wider distance D2 is lower than that in a second range R2 having the narrower distance D2. The thickness of the gradient magnetic field coil device 2 is thinner in the second range R2 than that such as in the first range R1, therefore amplitude of the vibration in this range is predicted to be the largest. Then, the distribution density of the reinforcing members 5 is made higher in the second range R2 than that in other areas. This allows for reducing the number of the reinforcing members 5 to reduce a cost.

Fifth Embodiment

Figure 10:
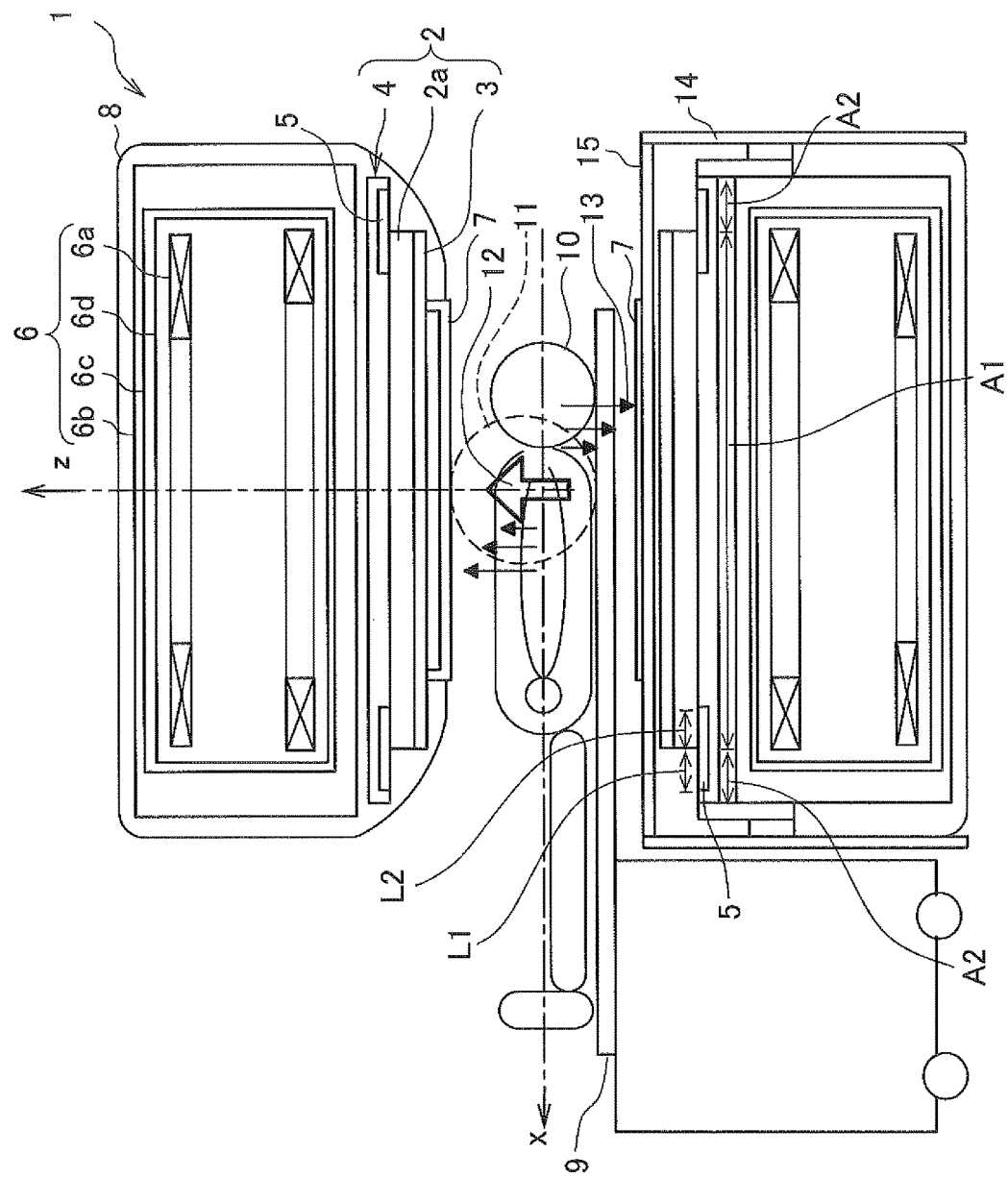
FIG. 10 is a longitudinal sectional view of an MRI device (of vertical magnetic field type) according to a fifth embodiment of the present invention.

FIG. 10 shows a longitudinal sectional view of the MRI device (vertical magnetic field type) 1 according to a fifth embodiment of the present invention. The fifth embodiment differs from the first embodiment on the point that the MRI device 1 is of a vertical magnetic field type instead of the horizontal magnetic field type. In association with this, the static magnetic field magnet device 6 (vacuum container 6b) is made of a pair of upper and lower members in a disc shape. The gradient magnetic field coil device 2 is also made of a pair of upper and lower members in a disc shape. The RF coil 7 is also made of a pair of upper and lower members in a disc shape. The outer cover 8 is also in a disc shape. Note that the magnetic field direction (vertical direction) of the static magnetic field 12 is usually defined as the z-axis, while the x-axis is defined to be a horizontal direction perpendicular to the z-axis and the y-axis is defined to be a direction orthogonal to both the z-axis and the x-axis. According to this, an example of the gradient magnetic field 13 shown in FIG. 10 is a gradient magnetic field tilted in the direction of x.

In addition, the main coil arrangement 3 of the gradient magnetic field coil device 2 is made of a pair of upper and lower members in a disc shape. The shield coil arrangement 4 of the gradient magnetic field coil device 2 is also made of a pair of upper and lower members in a disc shape. The main coil arrangement 3 and the shield coil arrangement 4 are bonded with interlayer resin 2a on respective surfaces which face each other. The diameter of the disc-shaped member of the shield coil arrangement 4 is made so as to be longer than that of the disc-shaped member of the main coil arrangement 3 in order to obtain a sufficient electromagnetic shielding effect for shielding the leakage magnetic field from the main coil arrangement 3. This causes the shield coil arrangement 4 to protrude beyond the end of the main coil arrangement 3. The shield coil arrangement 4 includes a facing area A1 that faces the main coil arrangement 3 and is fixed to the main coil arrangement 3, and a protruding area A2 that protrudes beyond the main coil arrangement 3. This causes the end of the gradient magnetic field coil device 2 (outer circumferential portion), where the protruding area A2 of the shield coil arrangement 4 exists, to be thin. Then, the protruding area A2 is arranged with insulated reinforcing members 5. The reinforcing members 5 extend not only in the protruding area A2 but also in the facing area A1. The reinforcing member 5 allows for increasing the rigidity in the protruding area A2, reducing amplitude of vibration in the protruding area A2 of the shield coil arrangement 4 when the MRI device 1 is in operation, and suppressing damages such as exfoliation of the bonding interface between the main coil arrangement 3 and the shield coil arrangement 4 at a root side of the protruding area A2. The length L1, in the radial direction (e.g., x-axis direction), of the reinforcing member 5 for a portion in the protruding area A2 is substantially equal to the length L2, in the radial direction, of the reinforcing member 5 for a portion in the facing area A1 (L1=L2). That is, in the radial direction (e.g., position in the x-axis direction) of the disc-shaped member of the shield coil arrangement 4, the central position of the reinforcing member 5 substantially coincides with the position of the end surface of the main coil arrangement 3. This allows for reliably reducing the amplitude of the vibration. Note that the coil conductor 4d is not wound in the fifth embodiment, and this allows for eliminating the spacers 4b as used in the first embodiment. In addition, the fifth embodiment may employ as the reinforcing member 5 a plate not only in a rectangular shape but also, in a plan view, in a sector shape or in a donut shape which is continuous in the circumferential direction.

The present invention is not intended to be limited to the first to fifth embodiments described above, and includes various modifications. For example, the first to fifth embodiments are described in detail in order to better illustrate the present invention and are not intended to limit the present invention always to those inclusive of full configuration as described above. In addition, the configuration of a certain embodiment can partially be replaced by the configuration of another embodiment, or the configuration of a certain embodiment can be added with the configuration of another embodiment. Also, the configuration of respective embodiments can partially be removed, or added with or replaced by another configuration.

The invention claimed is:

1. A gradient magnetic field coil device comprising:
a main coil arrangement that is formed by embedding into first resin a plurality of main coils for generating a gradient magnetic field and a leakage magnetic field; and
a shield coil arrangement that is formed by embedding into second resin a plurality of shield coils for suppressing the leakage magnetic field,
wherein the shield coil arrangement includes a facing area that faces the main coil arrangement and is fixed to the main coil arrangement, and a protruding area that protrudes beyond the main coil arrangement,
wherein a reinforcing insulator is embedded in the second resin to straddle between the facing area and the protruding area, and a central position of the reinforcing insulator substantially coincides with an end surface position of the main coil arrangement.

2. The gradient magnetic field coil device according to claim 1, wherein
the main coil arrangement and the shield coil arrangement are substantially in a disc shape, and
the main coil arrangement and the shield coil arrangement are bonded on respective surfaces which face each other.

3. The gradient magnetic field coil device according to claim 1, wherein
the main coil arrangement and the shield coil arrangement are substantially in a hollow cylindrical shape, and
the main coil arrangement is arranged inside the shield coil arrangement.

4. The gradient magnetic field coil device according to claim 3, wherein
the shield coil arrangement is substantially in a hollow cylindrical shape, and
a distance between the main coil arrangement and the shield coil arrangement varies with positions in a circumferential direction.

5. The gradient magnetic field coil device according to claim 3, wherein
the reinforcing member is one of a plurality of reinforcing members disposed circumferentially around an axial end of the shield coil arrangement,
spacers are embedded into the second resin over the facing area, at positions between adjacent pairs of the reinforcing members, and
each spacer has a surface on which the coil conductor is installed.

6. The gradient magnetic field coil device according to claim 5, wherein
widths, in the circumferential direction, of the reinforcing members and the spacers fall in a range of 10 mm to 30 mm,
lengths, in the axial direction, of the reinforcing members for a portion in the protruding area fall in a range of 50 mm to 150 mm, and
a distance, in the circumferential direction, between the spacers that are adjacent to each other falls in a range of 50 mm to 150 mm.

7. The gradient magnetic field coil device according to claim 3, wherein
the main coil arrangement and the shield coil arrangement are bobbinless coils.

8. The gradient magnetic field coil device according to claim 3, wherein
a plurality of the reinforcing members are arranged in the circumferential direction of the shield coil arrangement, and the second resin is filled between the reinforcing members which are adjacent to each other.

9. The gradient magnetic field coil device according to claim 1, wherein
one surface of the reinforcing member is along a side surface of the shield coil arrangement.

10. The gradient magnetic field coil device according to claim 1, wherein
the reinforcing member is arranged toward the main coil arrangement with respect to the shield coil arrangement.

11. The gradient magnetic field coil device according to claim 1, wherein
the reinforcing member is formed with grooves, and
a coil conductor constituting the shield coil is installed in the groove.

12. The gradient magnetic field coil device according to claim 1, wherein
the reinforcing member is arranged between windings of the shield coils that are adjacent to each other.

13. The gradient magnetic field coil device according to claim 1, wherein
the shield coil arrangement is in a hollow cylindrical shape, or in a disc shape.

14. An MRI device comprising:
a gradient magnetic field coil device according to claim 1; and
a static magnetic field magnet device that generates a static magnetic field which is uniform in terms of time and space,
wherein a gradient magnetic field and a static magnetic field overlap in an imaging space.

* * * * *